US006400203B1

(12) United States Patent
Bezzi et al.

(10) Patent No.: US 6,400,203 B1
(45) Date of Patent: Jun. 4, 2002

(54) HOT SWAP CURRENT LIMIT CIRCUITS AND METHODS

(75) Inventors: Francesco Bezzi, Santa Clara; Mehmet K. Nalbant, Cupertino, both of CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/633,542

(22) Filed: Aug. 7, 2000

(51) Int. Cl.[7] .................... H03K 5/08

(52) U.S. Cl. .................... 327/309

(58) Field of Search .................... 327/108, 109, 327/110, 111, 112, 309, 310, 312, 313, 318, 319, 324, 530, 538, 540, 541, 542, 543, 545, 546

(56) References Cited

U.S. PATENT DOCUMENTS 5,432,471 A * 7/1995 Majumdar et al. .......... 327/380
6,127,882 A * 10/2000 Vargha et al. .......... 327/540
6,188,210 B1 * 2/2001 Tichauer et al. .......... 323/273

* cited by examiner

*Primary Examiner*—Jeffrey Zweizig
(74) *Attorney, Agent, or Firm*—Blakely, Sokoloff, Taylor & Zafman LLP

(57) ABSTRACT

Hot swap current limit circuits and methods that provide soft start, current limiting and thermal limiting suitable for realization in a single integrated circuit. The circuits incorporate both a fast current limit loop to limit current spikes, and a slower current limit loop to more accurately limit the maximum or limit current to a predetermined value for longer periods, such as during start up or prolonged periods of excessive load conditions. Details of an exemplary embodiment circuit and method are disclosed.

9 Claims, 1 Drawing Sheet

HOT SWAP CURRENT LIMIT CIRCUITS AND METHODS

BACKGROUND OF THE INVENTION

1. Field of the Invention

The present invention relates to the field of ht swap circuits.

2. Prior Art

In many systems, it is desired to be able to replace a printed circuit board without shutting off power to the system. This is typically referred to as "hot swapping." In computer systems, hot swapping will allow the replacement of a board or the addition of a new board in the system without loss of information in volatile memory in the system, without requiring rebooting the system, etc. In systems such as communication systems and the like, wherein a plurality of boards of similar function are plugged into a motherboard, boards may be hot swapped or additional boards added without shutting down the system. This allows maintenance and upgrading without interfering with communications or other functions in channels serviced by the remaining boards in the system. In hot swapping applications, however, unless inrush currents are adequately limited, the addition of a board to a system in operation can cause a momentary power glitch that may disturb other circuits in the system.

The present invention pertains to ways and means of controlling the maximum current supplied to a load from a power line, as may be useful in hot swapping applications. Overcurrent conditions can be encountered either by temporal inrush currents that happen on load insertion, or by a more permanent fault condition on the load, like a short circuit. Such situations are known as "hot springs". Classical hot swap circuits are basically controlled switches that connect the load to the power supply line. Hot swap circuits provide a way to soft start the power line connection in order to limit the inrush current absorbed by a capacitive load. Also they allow turning the switch off if the current through the switch exceeds some pre-determined value. While the latter function is usually well controlled, the limitation of the inrush current during the start-up phase largely depends on the load. Most of the hot swap circuits now in use are slew-rate controllers, and can only work with certain load values.

BRIEF SUMMARY OF THE INVENTION

Hot swap current limit circuits and methods that provide soft start, current limiting and thermal limiting are disclosed. The circuits incorporate both a fast current limit loop to limit current spikes, and a slower current limit loop to more accurately limit the maximum or limit current to a predetermined value for longer periods, such as during start up or prolonged periods of excessive load conditions. Details of an exemplary embodiment circuit and method suitable for realization entirely in integrated circuit form are disclosed.

DETAILED DESCRIPTION OF THE PREFERRED EMBODIMENT

Figure 1:
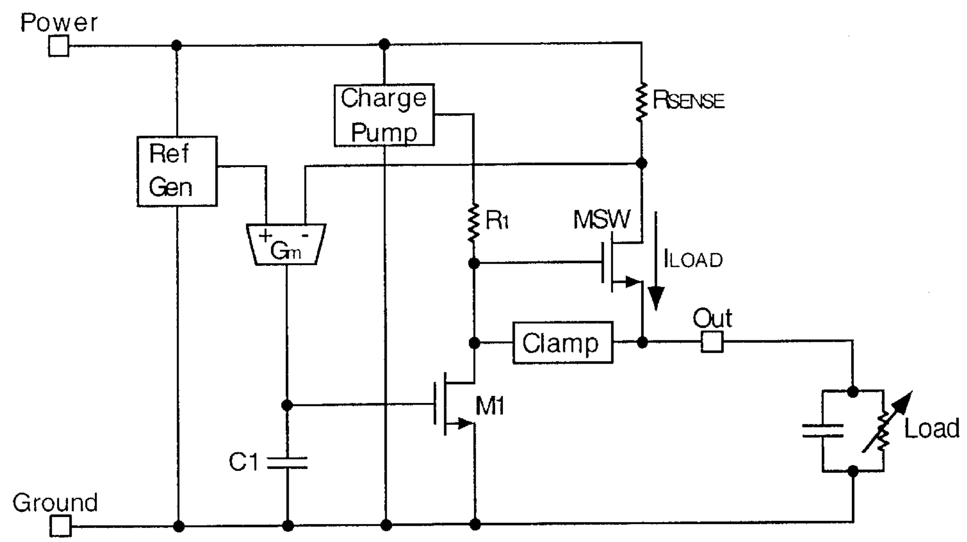
FIG. 1 is a circuit diagram of an exemplary embodiment of the present invention.

First referring to FIG. 1, a diagram illustrating one exemplary embodiment of the present invention may be seen. This embodiment is applicable to applications having a positive supply rail wherein the hot swap function is implemented using a NMOS transistor switch MSW. To fully enhance the NMOS transistor switch to provide the minimum ON resistance during normal operation, a charge pump may be used to provide a gate drive above voltage the positive supply rail voltage. (The charge pump may be of a conventional design, the details of which are not part of the invention described herein.) When transistor M1 is off, resistor R1 will pull the gate of NMOS transistor switch MSW to the charge pump voltage, driving the transistor switch to it minimum resistance. Controlling the conduction of transistor M1 by control of its gate controls the current through and thus the voltage drop across resistor R1, thereby controlling the gate voltage of NMOS transistor switch MSW. Alternatively or in addition, current through resistor R1 may substantially drop the charge pump voltage, depending on the relative current capacity of the charge pump, thereby also controlling the gate voltage of NMOS transistor switch MSW.

The current through resistor R1 is controlled by a feedback loop that senses the voltage across a current sense resistor RSENSE connected to the drain of the main switch. This voltage is compared to a reference voltage VREF by a transconductor that provides an output current proportional to the difference between the two inputs to tend to charge or discharge capacitor C1 and control the gate-source voltage of transistor M1 accordingly. The transconductor and capacitor therefore act as an integrator, integrating the error between the voltage across a current sense resistor RSENSE and the reference voltage VREF. If the voltage across the sense resistor RSENSE is less than VREF, the capacitor C1 is discharged and the gate of transistor M1 is driven low, turning off the transistor so no current will flow through resistor R1. The gate of NMOS transistor switch MSW is then driven high by the charge pump and the transistor switch is fully enhanced. As the current through the switch increases and the sense voltage approaches VREF, the loop will begin to turn on transistor M1, pulling current from the charge pump. If the current through resistor R1 exceeds the charge pump driving capability, the gate voltage of the NMOS transistor switch MSW is reduced, so that NMOS transistor switch MSW behaves as a controlled current source. The limiting current ILIMIT is given by ILIMIT=VREF/RSENSE, at which point the voltage across the sense resistor RSENSE will be equal to the reference voltage VREF. Under these conditions, the voltage on the capacitor C1 will remain substantially constant until the current falls below the limit current ILIMIT.

Capacitor C1 provides compensation for loop stability. Since the response time of this loop can be slow due to the big gate capacitance of the NMOS transistor switch MSW, (normally having very large dimensions to lower the ON resistance of the switch), a fast clamp circuit is used to limit the VGS of the switch during fast transients. The clamp both limits the current and protects the switch.

Figure 2:
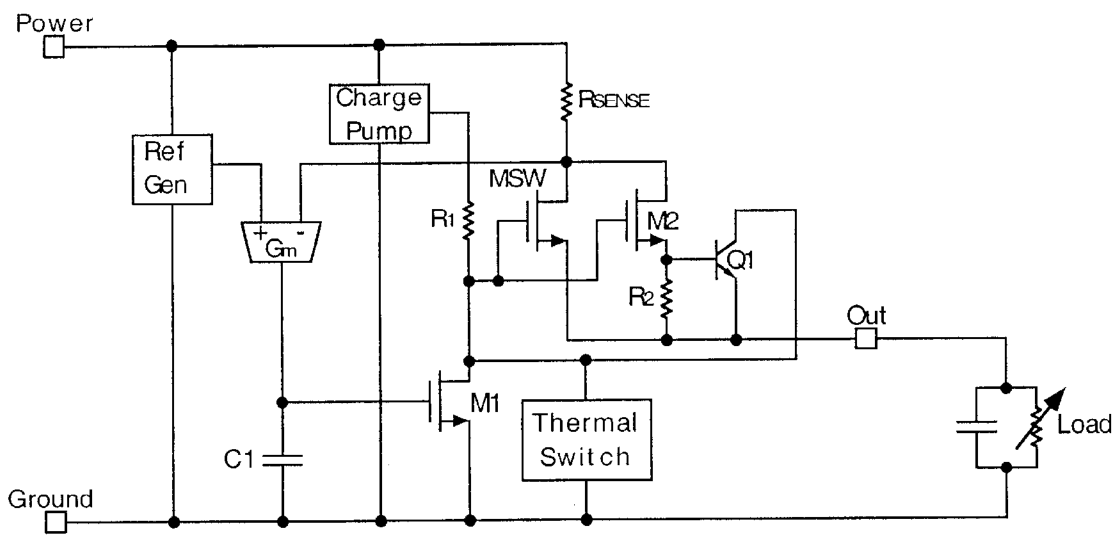
FIG. 2 is a circuit diagram of an exemplary embodiment of the present invention including an exemplary embodiment of the fast clamp circuit

Details of the clamp circuit are shown in FIG. 2. A passive clamp will limit the gate-source voltage on the NMOS transistor switch MSW to Vbe +Vz (where Vz is the zener diode voltage). If the voltage across resistor R2 exceeds one Vbe, transistor Q1 will rapidly turn on and pull down the gate voltage on the NMOS transistor switch MSW (and transistor M2). However the limit current of this fast loop is not very well controlled, and therefore is preferably designed to always be 3 to 4 times the limit current of the slower precision loop so that the two loops will not interfere with each other.

The circuit provides an easy way to program the limiting current, namely by changing the reference voltage VREF. VREF is designed to have substantially the same temperature coefficient of RSENSE so that the limiting current value will be substantially temperature independent. If a thin film resistance is used for the sense resistor, then a conventional band gap reference may be used to generate a voltage independent of temperature.

A thermal shutdown circuit, also shown in FIG. 2, will detect an over-temperature on the chip and pull a large current through resistor R1, shutting down the switch. The thermal switch may have some thermal hysteresis so as to attempt to restart the load after the circuit cools at least a few degrees, or alternatively only limit the current as required to prevent significant further heating of the circuit.

Such circuits are well known and therefore the thermal shut down circuit is not described in detail herein. In the preferred embodiment, the entire circuit as shown in FIGS. 1 and 2 (other than the load itself) is realized in a single integrated circuit, including the sense resistor, voltage reference and the NMOS transistor switch MSW.

Although the exemplary circuit is designed for positive supplies hot swapped through NMOS devices, those skilled in the art may readily apply the same concept to negative supplies hot swapped through PMOS devices. In addition, the control loops can be adapted to operate either with positive supplies and PMOS switches or negative supplies and NMOS switches. In these later cases, no charge pump action is needed and the sense resistor is connected at the source side of the switch.

The foregoing invention also controls and limits the current during the startup phase. The advantage of the present invention is that it broadens the range of capacitive loads that can be used (the maximum slew rate becomes a function of the load) and minimizes the turn-on time by providing an inrush current that is always close to the limit value. Even in the case of a permanent fault condition, the current through the switch will never exceed the pre-programmed value. In this case though, the heat generated by the prolonged power dissipation in the switch can be very high. This is why a fully integrated solution with a thermal protection is used. Having the switch and the thermal shutdown integrated on the same chip provides much better protection on the switch and at the same end improves the long-term reliability of the device.

There has been described herein a hot swap current limit circuit that provides soft start, current limiting and thermal limiting in a single integrated circuit. The circuit incorporates both a fast current limit loop to limit current spikes, and a slower current limit loop to more accurately limit the maximum or limit current to a predetermined value for longer periods, such as during start up or prolonged periods of excessive load conditions. While the present invention has been disclosed and described with respect to certain exemplary embodiments thereof, it will be understood by those skilled in the art that the present invention may be varied without departing from the spirit and scope thereof.

What is claimed is:

1. A current limit circuit having first and second power input terminals and an output terminal for limiting the current on the output terminal, comprising:

an output transistor and a second transistor, each having first and second terminals and a control terminal, the current between the first and second terminals being responsive to the voltage between the respective control terminal and first terminal;

a differential transconductance amplifier;

a sense resistor and a second resistor;

a capacitor;

the sense resistor being coupled between the first power input terminal and the second terminal of the output transistor, the first terminal of the output transistor being coupled to the output terminal;

the second resistor being coupled between a voltage and the control terminal of the output transistor;

the second transistor having its second terminal coupled to the control terminal of the output transistor, and its first terminal coupled to the second power input terminal;

the transconductance amplifier having inputs coupled to the second terminal of the output transistor and a reference voltage and an output coupled to the control terminal of the second transistor;

the capacitor being coupled between the control terminal of he second transistor and the second power input terminal.

2. The current limit circuit of claim 1 further comprised of a charge pump, wherein the second resistor is coupled between an output of the charge pump and the control terminal of the output transistor.

3. The current limit circuit of claim 1 further comprised of a voltage clamp coupled between the control terminal and the first terminal of the output transistor to limit the voltage between the control terminal and the first terminal of the output transistor.

4. The current limit circuit of claim 3 wherein the voltage clamp is comprised of:

third and fourth transistors, each having first and second terminals and a control terminal, the current between the first and second terminals being responsive to the voltage between the respective control terminal and first terminal;

a second resistor;

the first terminal of the third transistor being coupled through the second resistor to the first terminal of the output transistor, the control terminal of the third transistor being coupled to the control terminal of the output transistor and the second terminal of the third transistor being coupled to the second terminal of the output transistor;

the fourth transistor having its control terminal coupled to the first terminal of the third transistor, its first terminal coupled to the first terminal of the output transistor and its second terminal coupled to the control terminal of the output transistor.

5. The current limit circuit of claim 4 wherein the output second and third transistors are MOS transistors and the fourth transistor is a bipolar transistor.

6. The current limit circuit of claim 5, further comprised of a thermal shutdown circuit coupled between the control terminal of the output transistor and the second power input terminal.

7. The current limit circuit of claim 6 wherein the current limit circuit is realized in a single integrated circuit.

8. The current limit circuit of claim 1 further comprised of a thermal shutdown circuit coupled between the control terminal of the output transistor and the second power input terminal.

9. The current limit circuit of 8 wherein the current limit circuit is realized in a single integrated circuit.

* * * * *

UNITED STATES PATENT AND TRADEMARK OFFICE

CERTIFICATE OF CORRECTION

PATENT NO. : 6,400,203 B1
DATED : June 4, 2002
INVENTOR(S) : Bezzi et al.

It is certified that error appears in the above-identified patent and that said Letters Patent is hereby corrected as shown below:

Title page,
Item [75], Inventors, please delete inventor name "Francesco Bezzi" and insert -- Francesco Rezzi --.

Signed and Sealed this

Seventh Day of January, 2003

JAMES E. ROGAN
*Director of the United States Patent and Trademark Office*